(12) United States Patent
Chen et al.

(10) Patent No.: US 9,460,956 B2
(45) Date of Patent: Oct. 4, 2016

(54) METHOD OF FORMING SHALLOW TRENCH ISOLATION AND SEMICONDUCTOR DEVICE

(71) Applicant: Taiwan Semiconductor Manufacturing Company Limited, Hsinchu (TW)

(72) Inventors: De-Fang Chen, Hsinchu (TW); Teng-Chun Tsai, Hsinchu (TW); Ching-Feng Fu, Taichung (TW); Cheng-Tung Lin, Hsinchu County (TW); Li-Ting Wang, Hsinchu (TW); Chih-Tang Peng, Hsinchu County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 97 days.

(21) Appl. No.: 14/302,504

(22) Filed: Jun. 12, 2014

(65) Prior Publication Data

US 2015/0364360 A1   Dec. 17, 2015

(51) Int. Cl.

| | |
|---|---|
| H01L 21/762 | (2006.01) |
| H01L 21/02 | (2006.01) |
| H01L 21/311 | (2006.01) |
| H01L 21/306 | (2006.01) |
| H01L 21/3105 | (2006.01) |
| H01L 29/66 | (2006.01) |
| H01L 29/78 | (2006.01) |
| H01L 21/84 | (2006.01) |
| H01L 29/06 | (2006.01) |

(52) U.S. Cl.
CPC ..... *H01L 21/76224* (2013.01); *H01L 21/0217* (2013.01); *H01L 21/0228* (2013.01); *H01L 21/02164* (2013.01); *H01L 21/02271* (2013.01); *H01L 21/30604* (2013.01); *H01L 21/31055* (2013.01); *H01L 21/31111* (2013.01); *H01L 21/31116* (2013.01); *H01L 21/76229* (2013.01); *H01L 21/845* (2013.01); *H01L 29/0673* (2013.01); *H01L 29/66666* (2013.01); *H01L 29/66795* (2013.01); *H01L 29/7827* (2013.01); *H01L 29/7851* (2013.01); *H01L 29/0649* (2013.01)

(58) Field of Classification Search
CPC .............. H01L 29/66795; H01L 29/7851; H01L 29/7827; H01L 27/0886; H01L 27/10876; H01L 27/10823; H01L 27/10826; H01L 21/76224; H01L 21/845; H01L 21/76229

See application file for complete search history.

(56) References Cited

U.S. PATENT DOCUMENTS

| | | | | |
|---|---|---|---|---|
| 7,824,983 B2* | 11/2010 | Juengling | ....... | H01L 21/823431 257/E21.54 |
| 8,377,813 B2* | 2/2013 | Lin | .................. | H01L 27/10891 257/E21.19 |
| 9,082,698 B1* | 7/2015 | Joshi | ..................... | H01L 21/265 |
| 2008/0121970 A1* | 5/2008 | Aritome | ............ | H01L 21/28273 257/316 |
| 2014/0124860 A1* | 5/2014 | Cheng | ................... | H01L 21/845 257/347 |

* cited by examiner

*Primary Examiner* — Michael Trinh
(74) *Attorney, Agent, or Firm* — Jones Day

(57) ABSTRACT

According to an exemplary embodiment, a semiconductor device is provided. The semiconductor device includes: a substrate; a first vertical structure protruding from the substrate; a second vertical structure protruding from the substrate; an STI between the first vertical structure and the second vertical structure; wherein a first horizontal width between the first vertical structure and the STI is substantially the same as a second horizontal width between the second vertical structure and the STI.

20 Claims, 24 Drawing Sheets

METHOD OF FORMING SHALLOW TRENCH ISOLATION AND SEMICONDUCTOR DEVICE

BACKGROUND

Vertical semiconductor devices, such as vertical gate-all-around transistors, are very popular, but are fabricated using complex processes that produce defects. Therefore, there is a need to facilitate the manufacture thereof.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
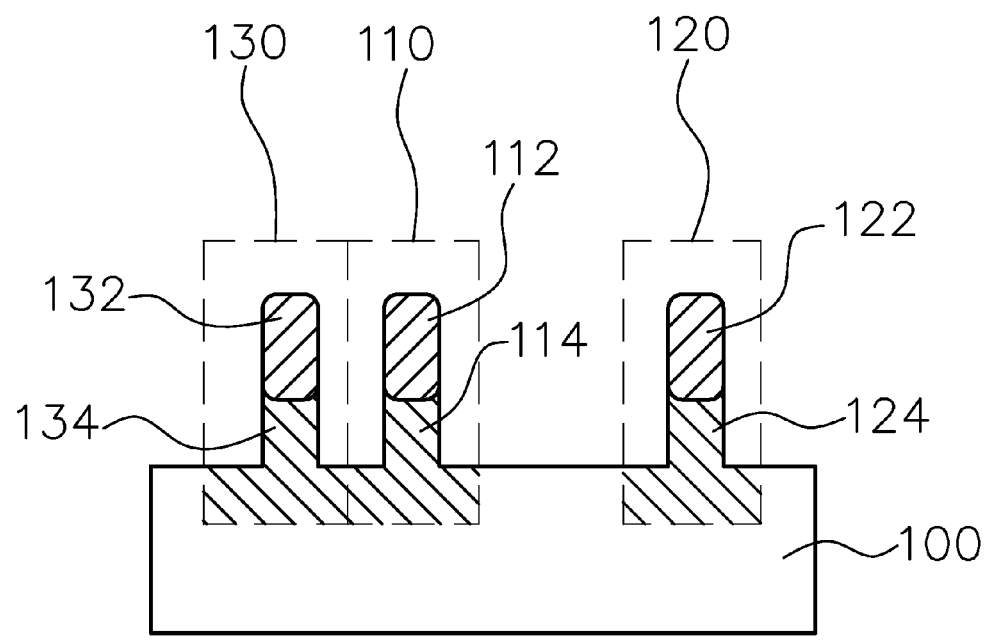
FIGS. 1-6 are sectional views illustrating an exemplary semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The disclosure describes a method of forming a shallow trench isolation (STI) between a first vertical structure and a second vertical structure in a substrate. The method may be further integrated with vertical structure (e.g., nanowire) formation and N/P well implantation process. In order to form the shallow trench isolation, the method includes: conformally depositing a dielectric layer over the substrate, the first vertical structure, and the second vertical structure; etching the dielectric layer to form a spacer for protecting the first vertical structure and the second vertical structure and to expose a portion of the substrate corresponding to the shallow trench isolation; etching the exposed portion of the substrate to form a recess corresponding to the shallow trench isolation; removing the dielectric layer; and forming an oxide layer in the recess as the shallow trench isolation.

The method may be called a "self-aligned STI formation" technique which provides controllable symmetric spacing between the vertical structures and the STI. The symmetric spacing between each of the vertical structures and the STI may be about 5-20 nanometers, and there is no lithography overlay shift risk when using the disclosed method of forming the STI. The spacing can be measured by transmission electron microscope (TEM) analysis.

Moreover, the vertical structures may refer to vertical gate all around (VGAA) transistors made of materials: Si, SiGe, Ge, or III-V (InP, GaAs, AlAs, InAs, InAlAs, InGaAs, InSb, GaSb, InGaSb). After performing the method of forming the STI, the vertical structures may be resized by using, for example, hard mask trimming and in-situ steam generation (ISSG).

FIG. 1 is a sectional view illustrating an exemplary semiconductor device in accordance with some embodiments. As shown in FIG. 1, a substrate 100 is provided. A first vertical structure 110, a second vertical structure 120, and a third vertical structure 130 are provided over the substrate 100. In the embodiment, each of the vertical structures 110, 120, 130 include hard masks 112, 122, 132 and nanowires 114, 124, 134 respectively. The nanowires 114, 124, 134 may include a source, a channel, and a drain. In some embodiments, before finishing the method of forming an STI, the nanowires 114, 124, 134 do not include a source, a channel, and a drain which may be formed thereafter. The material of the substrate 100 may include: Si, SiGe, Ge, or III-V (InP, GaAs, AlAs, InAs, InAlAs, InGaAs, InSb, GaSb, InGaSb).

Figure 2:
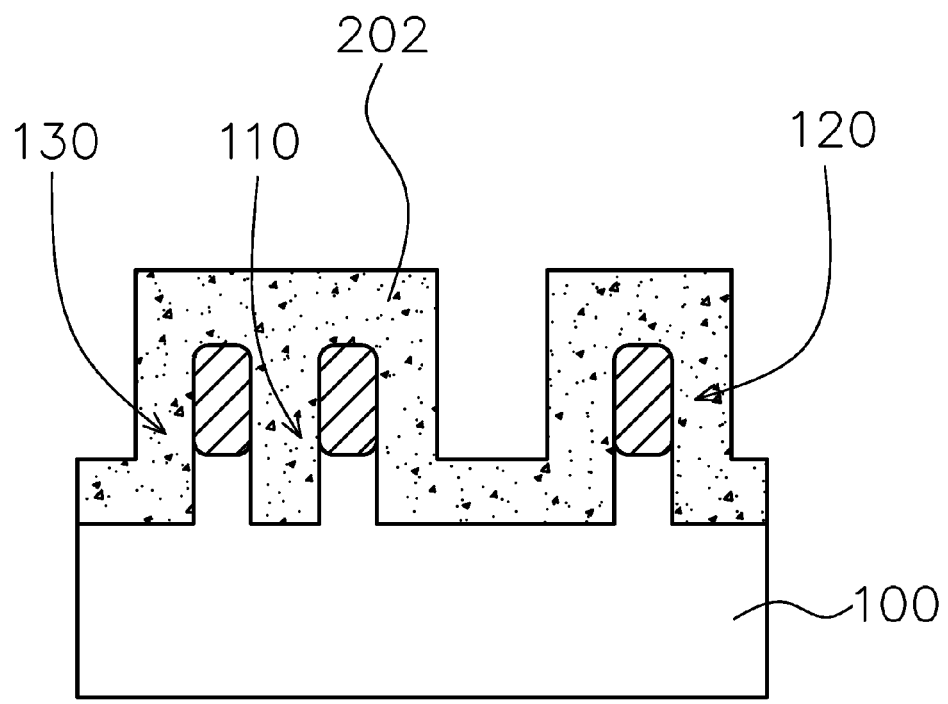

FIG. 2 is a sectional view illustrating the exemplary semiconductor device in accordance with some embodiments. As shown in FIG. 2, a dielectric layer 202 is conformally formed over the substrate 100, the first vertical structure 110, the second vertical structure 120, and the third vertical structure 130 by using, for example, atomic layer deposition (ALD). The conformal dielectric layer 202 is a dielectric material layer that includes a dielectric material such as silicon oxide, silicon nitride, silicon oxynitride, a dielectric metal oxide, a dielectric metal nitride, a dielectric oxynitride, or a combination thereof. In one embodiment, the conformal dielectric layer 202 can have the same thickness in vertical portions as in horizontal portions. The dielectric layer 202 between the first vertical structure 110 and the third vertical structure 130 can be well controlled to merge when we do not design a STI formation disposing therebetween. The dielectric layer 202 defines the STI formation, so that the substrate 100 with the dielectric layer 202 does not overlap with the STI formation.

Figure 3:
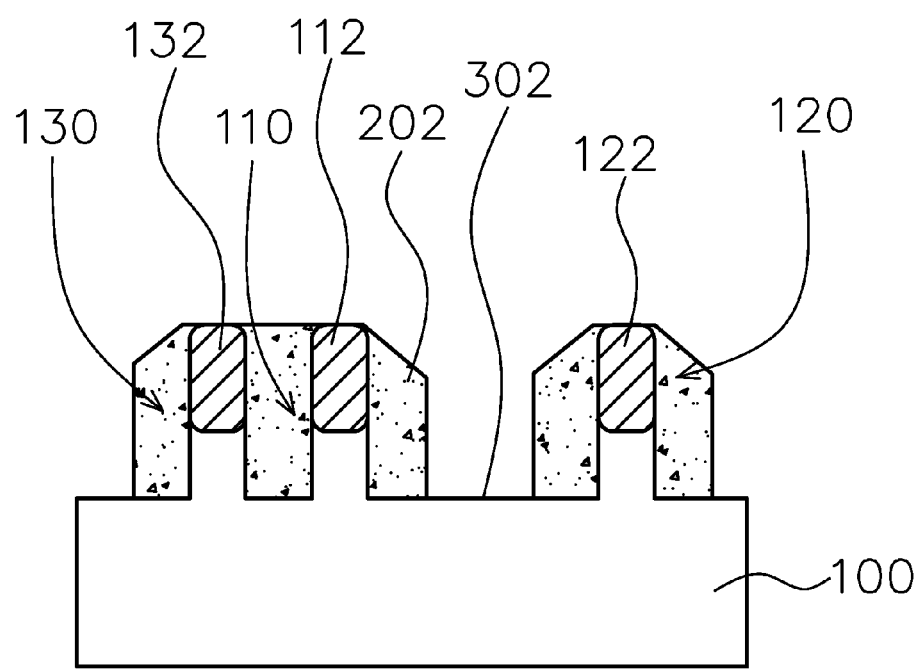

FIG. 3 is a sectional view illustrating the exemplary semiconductor device in accordance with some embodiments. As shown in FIG. 3, the dielectric layer 202 is etched to expose a portion 302 of the substrate 100 corresponding to the shallow trench isolation by using plasma etching. The dielectric layer 202 is anisotropically etched in an anisotropic etch process. Each of the hard masks 112, 122, 132 of the vertical structures 110, 120, 130 is exposed after the anisotropic etching. Plasma etching refers to the removal of material, typically a masked pattern of semiconductor material, by exposing the material to a bombardment of ions (usually a plasma of reactive gases such as fluorocarbons, oxygen, chlorine, boron trichloride; sometimes with addition of nitrogen, argon, helium and other gases) that dislodge portions of the material from the exposed surface.

Figure 4:
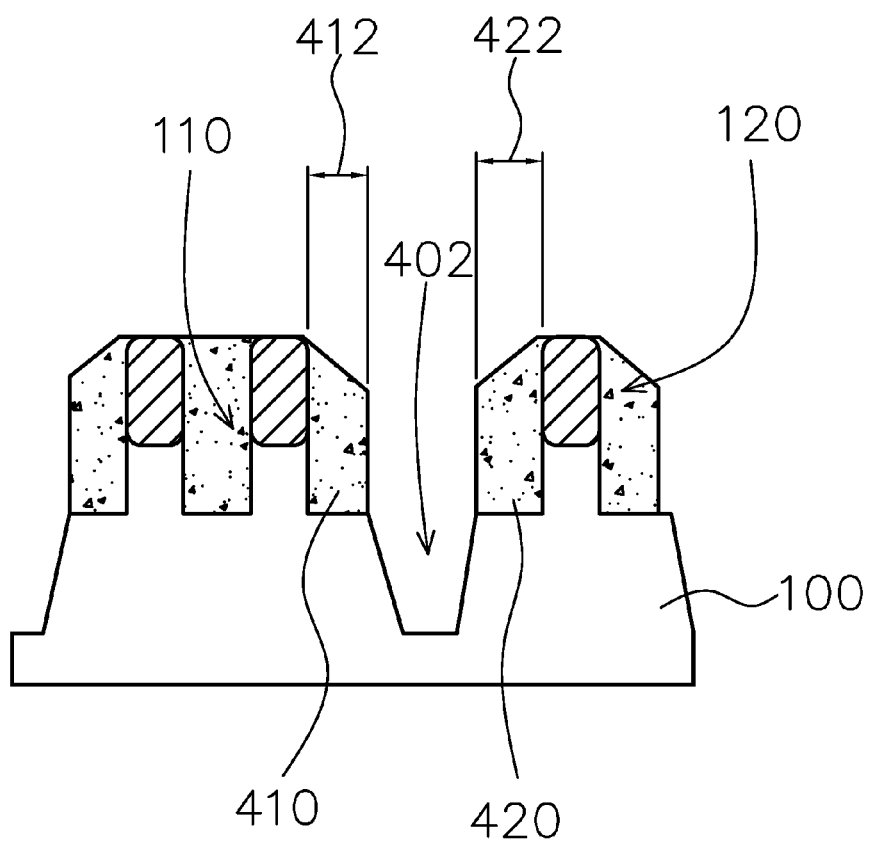

FIG. 4 is a sectional view illustrating the exemplary semiconductor device in accordance with some embodiments. As shown in FIG. 4, the exposed portion of the substrate 100 is etched to form a recess 402 corresponding to the shallow trench isolation by using plasma etching. A first spacer 410 adjacent to the first vertical structure 110 and a second spacer 420 adjacent to the second vertical structure 120 are formed accordingly. The first horizontal width 412 of the first spacer 410 may be about 5-20 nanometers and substantially the same as the second horizontal width 422 of the second spacer 420.

Figure 5:
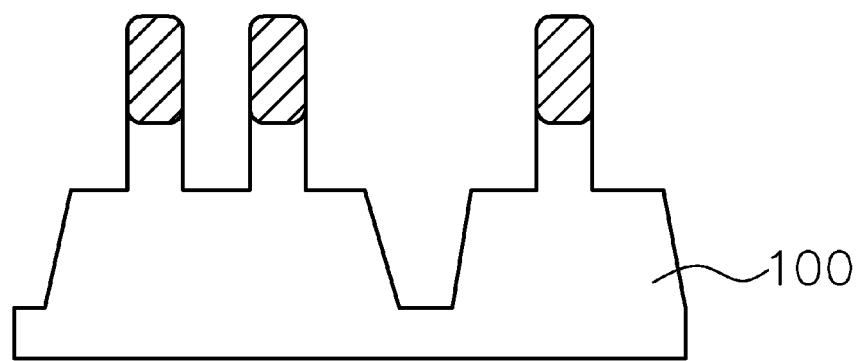

FIG. 5 is a sectional view illustrating the exemplary semiconductor device in accordance with some embodiments. As shown in FIG. 5, the dielectric layer over the substrate 100 is removed.

Figure 6:
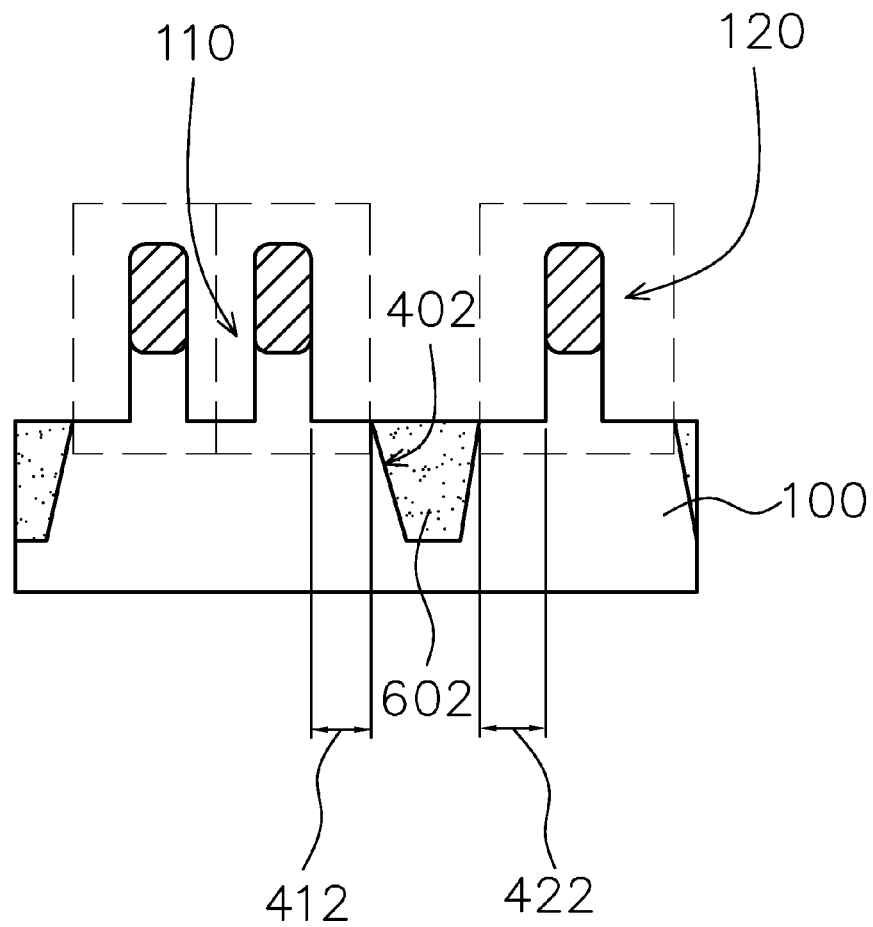

FIG. 6 is a sectional view illustrating the exemplary semiconductor device in accordance with some embodiments. As shown in FIG. 6, an oxide layer is formed in the recess 402 as the shallow trench isolation 602.

Each of the first vertical structure 110 and the second vertical structure 120 protrudes from the substrate 100. The STI 602 is located between the first vertical structure 110 and the second vertical structure 120. In some embodiments, the first horizontal width 412 (equals to a distance between the first vertical structure 110 and the STI 602) is substantially the same as the second horizontal width 422 (equals to a distance between the second vertical structure 120 and the STI 602).

The method may be called "self-aligned STI formation" technique which provides controllable symmetric spacing between the vertical structures 110, 120 and the STI 602. The symmetric spacing, that is horizontal width, may be about 5-20 nanometers, and there is no lithography overlay shift risk when using the method of forming the STI. The spacing could be measured by transmission electron microscope (TEM) analysis. Compared to lithography processes generating a difference between the first horizontal width 412 and the second horizontal width 422 larger than about 5 nanometers, the disclosed method provides better control over the horizontal widths 412, 422 with a difference less than about 1 nanometer.

Figure 7:
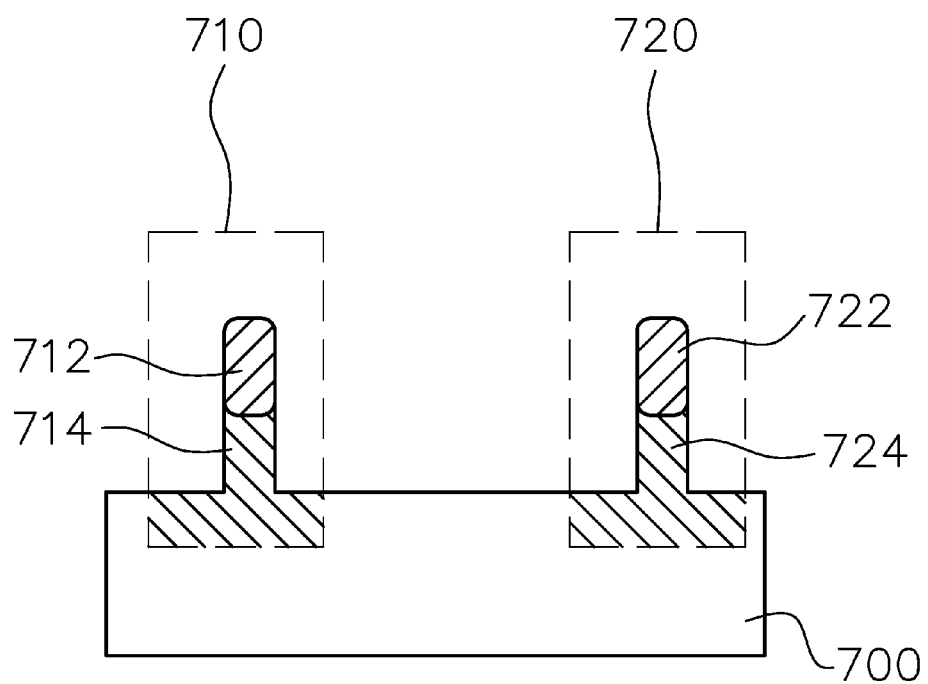
FIGS. 7-21 are sectional views illustrating another exemplary semiconductor device in accordance with some embodiments.

FIG. 7 is a sectional view illustrating an exemplary semiconductor device in accordance with some embodiments. As shown in FIG. 7, a substrate 700 is provided. A first vertical structure 710 and a second vertical structure 720 are provided over the substrate 700. In the embodiment, each of the vertical structures 710, 720 includes hard masks 712, 722 and nanowires 714, 724 respectively. The nanowires 714, 724 may include a source, a channel, and a drain. In some embodiments, before finishing the method of forming an STI, the nanowires 714, 724 do not include a source, a channel, and a drain which may be formed thereafter. The material of the substrate 700 may include: Si, SiGe, Ge, or III-V (InP, GaAs, AlAs, InAs, InAlAs, InGaAs, InSb, GaSb, InGaSb).

Figure 8:
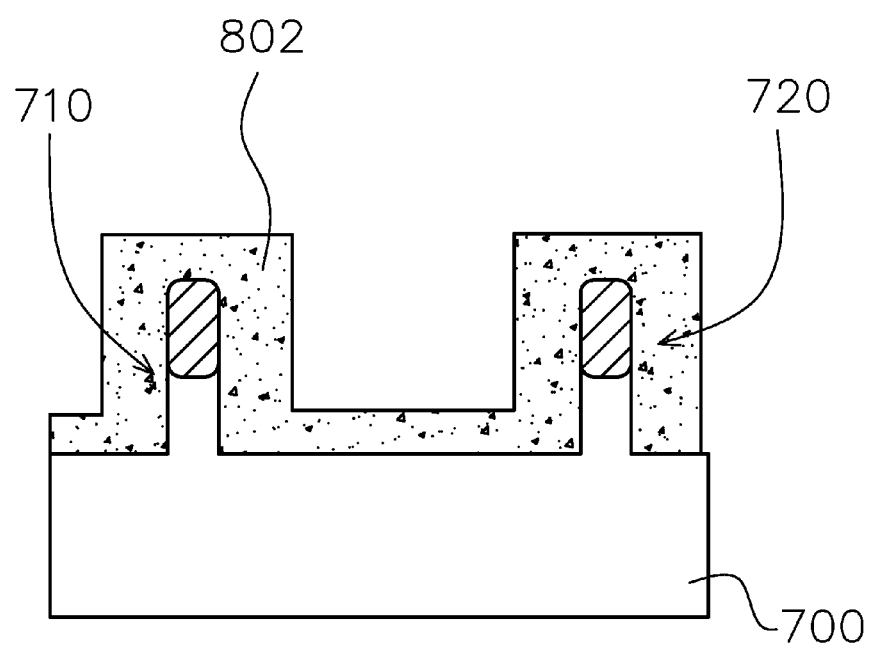

FIG. 8 is a sectional view illustrating the exemplary semiconductor device in accordance with some embodiments. As shown in FIG. 8, a dielectric layer 802 is conformally formed over the substrate, the first vertical structure 710 and the second vertical structure 720 by using, for example, atomic layer deposition (ALD). The conformal dielectric layer 802 is a dielectric material layer that includes a dielectric material such as silicon oxide, silicon nitride, silicon oxynitride, a dielectric metal oxide, a dielectric metal nitride, a dielectric oxynitride, or a combination thereof. In one embodiment, the conformal dielectric layer 802 can have the same thickness in vertical portions as in horizontal portions.

Figure 9:
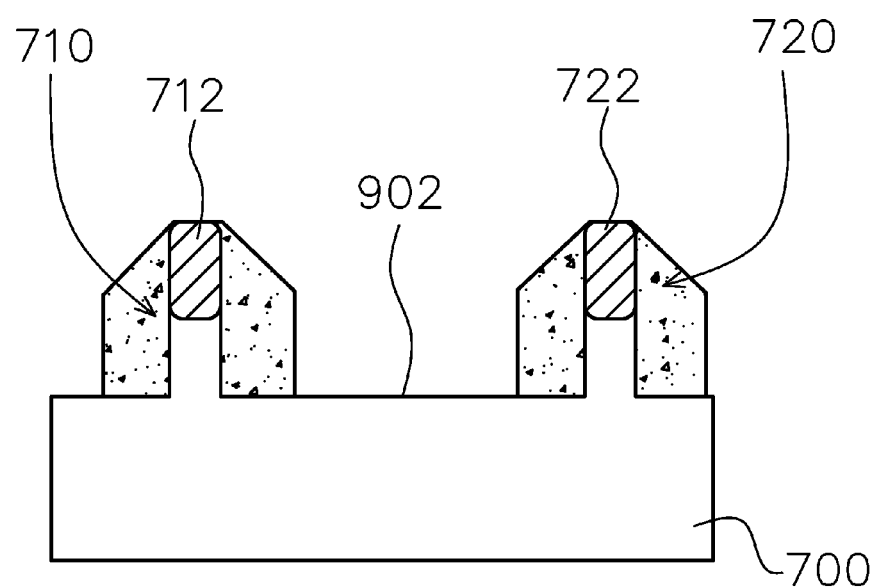

FIG. 9 is a sectional view illustrating the exemplary semiconductor device in accordance with some embodiments. As shown in FIG. 9, the dielectric layer 802 is etched to expose a portion 902 of the substrate 700 corresponding to the shallow trench isolation by using plasma etching. The dielectric layer 802 is anisotropically etched in an anisotropic etch process. Each of the hard masks 712, 722 of the vertical structures 710, 720 is exposed after the anisotropic etching. Plasma etching refers to the removal of material, typically a masked pattern of semiconductor material, by exposing the material to a bombardment of ions (usually a plasma of reactive gases such as fluorocarbons, oxygen, chlorine, boron trichloride; sometimes with addition of nitrogen, argon, helium and other gases) that dislodge portions of the material from the exposed surface.

Figure 10:
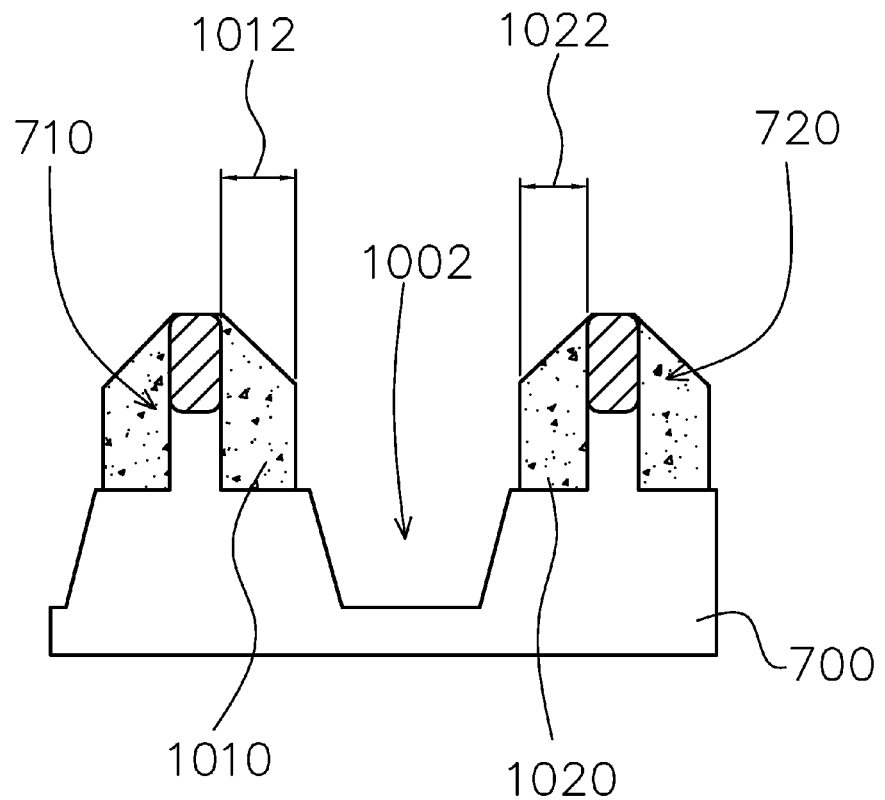

FIG. 10 is a sectional view illustrating the exemplary semiconductor device in accordance with some embodiments. As shown in FIG. 10, the exposed portion of the substrate 700 is etched to form a recess 1002 corresponding to the shallow trench isolation by using plasma etching. A first spacer 1010 adjacent to the first vertical structure 710 and a second spacer 1020 adjacent to the second vertical structure 720 are formed accordingly. The first horizontal width 1012 of the first spacer 1010 may be about 5-20 nanometers and substantially the same as the second horizontal width 1022 of the second spacer 1020.

Figure 11:
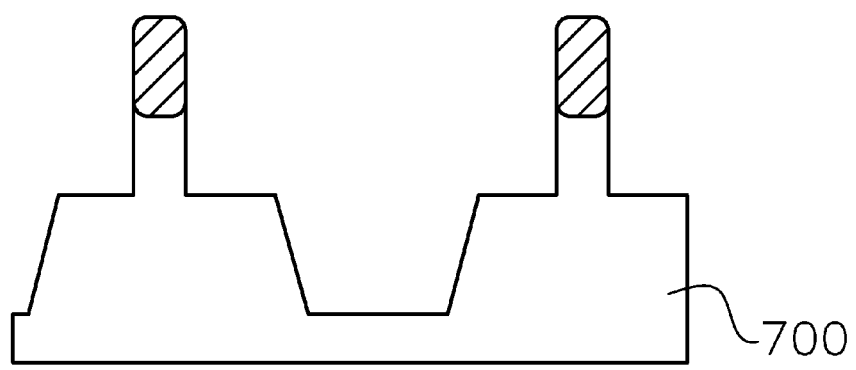

FIG. 11 is a sectional view illustrating the exemplary semiconductor device in accordance with some embodiments. As shown in FIG. 11, the dielectric layer over the substrate 700 is removed.

Figure 12:
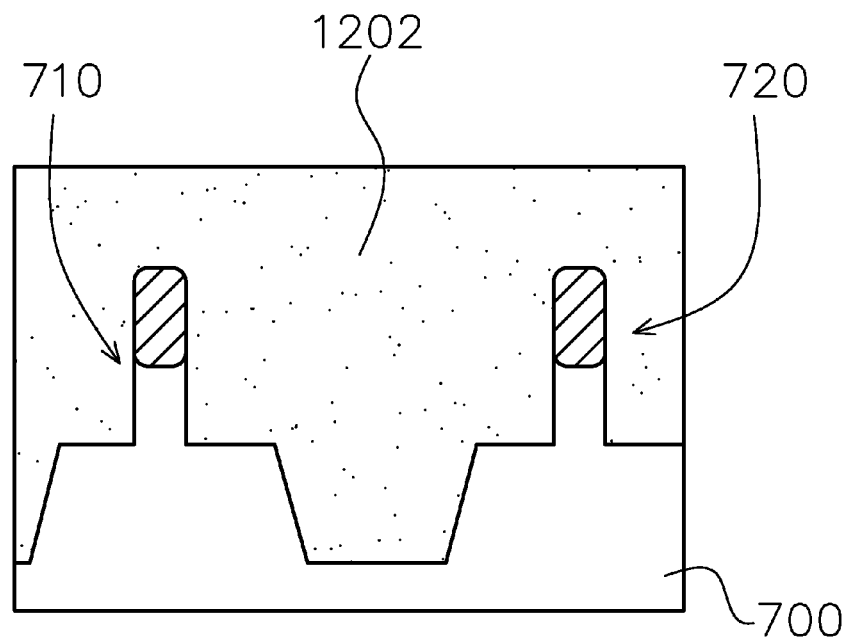

FIG. 12 is a sectional view illustrating the exemplary semiconductor device in accordance with some embodiments. As shown in FIG. 12, an oxide layer 1202 is formed over the substrate 700, the first vertical structure 710, and the second vertical structure 720 by using, for example, flowable chemical vapor deposition with a low temperature anneal (less than 500° C.).

Figure 13:
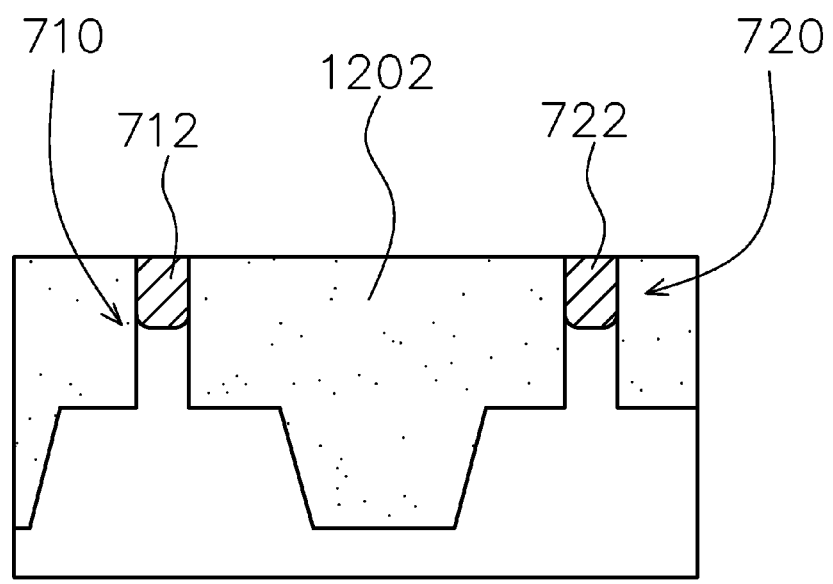

FIG. 13 is a sectional view illustrating the exemplary semiconductor device in accordance with some embodiments. As shown in FIG. 13, chemical mechanical polishing (CMP) is performed on the oxide layer 1202 and stopping on top of the first vertical structure 710 and the second vertical structure 720, which are respectively the hard masks 712, 722. CMP is a process of smoothing surfaces with the combination of chemical and mechanical forces.

Figure 14:
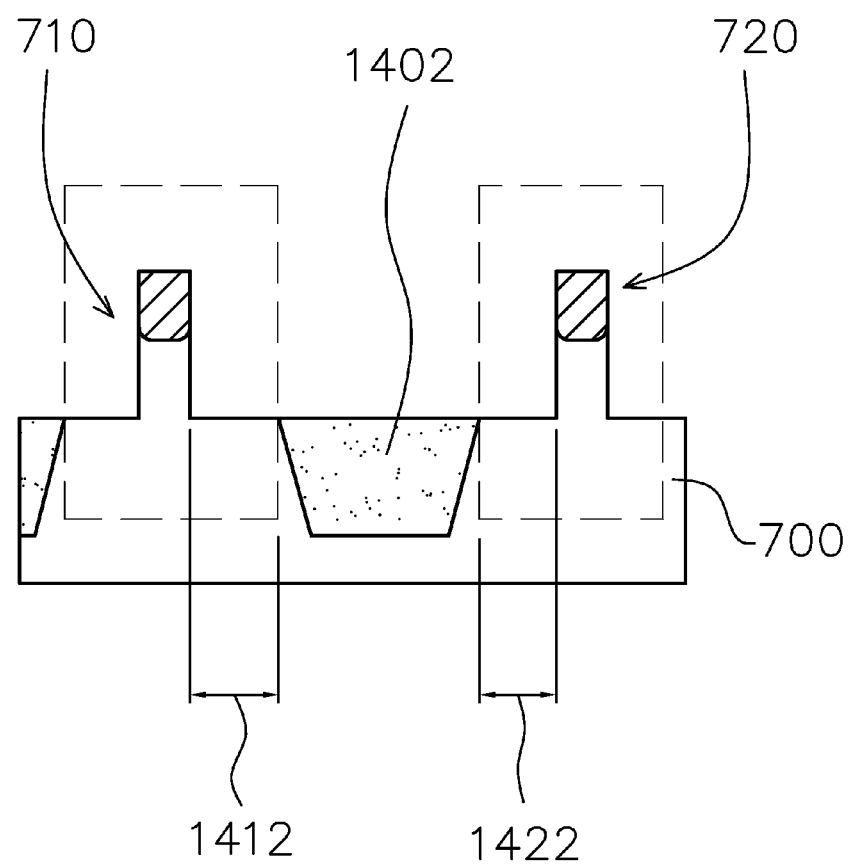

FIG. 14 is a sectional view illustrating the exemplary semiconductor device in accordance with some embodiments. As shown in FIG. 14, the oxide layer 1202 is etched to expose the substrate 700 and to form a shallow trench isolation 1402. Each of the first vertical structure 710 and the second vertical structure 720 protrudes from the substrate 700. The STI 1402 is between the first vertical structure 710 and the second vertical structure 720. In some embodiments, the first horizontal width 1412 (equals to a distance between the first vertical structure 710 and the STI 1402) is substantially the same as the second horizontal width 1422 (equals to a distance between the second vertical structure 720 and the STI 1402).

The method may be called a "self-aligned STI formation" technique which provides controllable symmetric spacing between the vertical structures 710, 720 and the STI 1402. The symmetric spacing, that is horizontal width, may be about 5-20 nanometers, and there is no lithography overlay shift risk when using the method of forming the STI. Said spacing could be found by transmission electron microscope (TEM) analysis. Compared to lithography processes generating a difference between the first horizontal width 1412 and the second horizontal width 1422 larger than about 5 nanometers, the method provides a better control over the horizontal widths 1412, 1422 with a difference less than about 1 nanometer.

Figure 15:
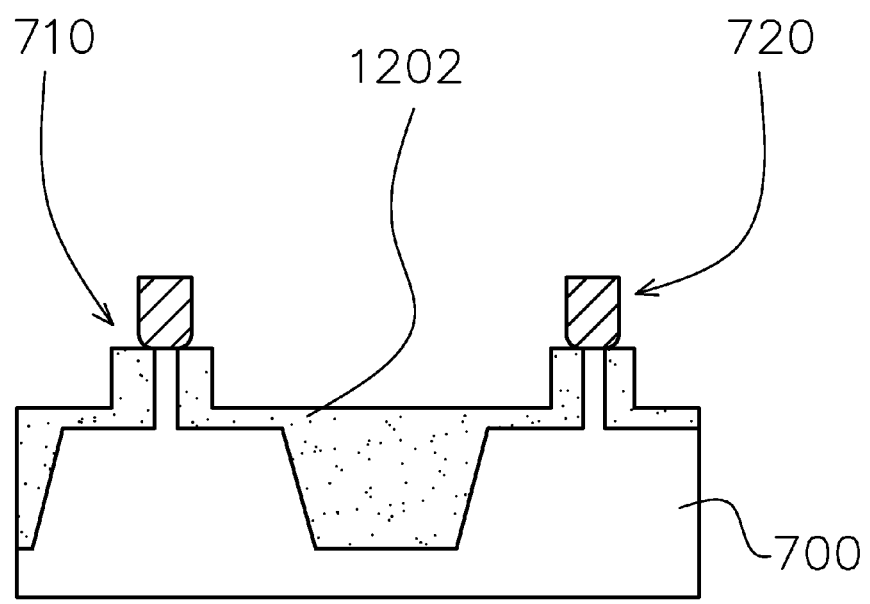

FIG. 15 is a sectional view illustrating the exemplary semiconductor device in accordance with some embodiments. As shown in FIG. 15, $H_2$ anneal is used to form a smooth surface on the substrate 700, the first vertical structure 710, and the second vertical structure 720. Moreover, an in-situ steam generation (ISSG) process is performed to trim the size of the first vertical structure 710 and the second vertical structure 720. Additionally, a high temperature (400° C.-800° C.) anneal lasting 5-60 minutes is used for STI enhancement. As such, the oxide layer 1202 grows and covers the substrate 700, the first vertical structure 710, and the second vertical structure 720.

Figure 16:
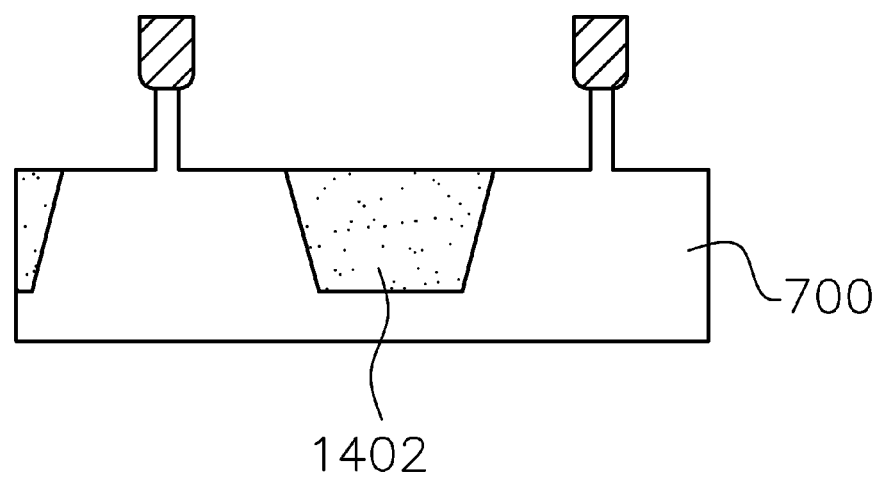

FIG. 16 is a sectional view illustrating the exemplary semiconductor device in accordance with some embodiments. As shown in FIG. 16, the oxide layer is etched again to expose the substrate 700 and the shallow trench isolation 1402.

Figure 17:
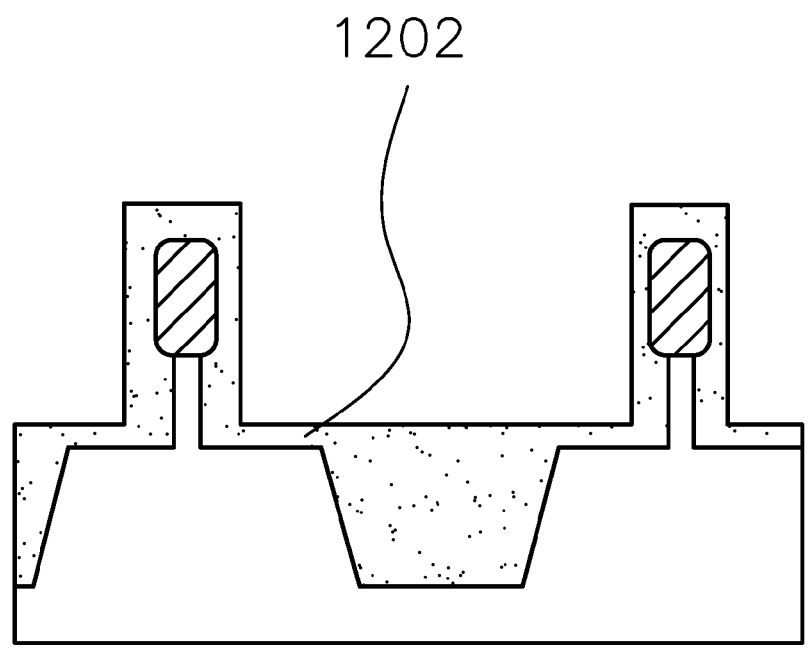

FIG. 17 is a sectional view illustrating the exemplary semiconductor device in accordance with some embodiments. As shown in FIG. 17, the oxide layer 1202 is deposited again as a screening oxide (e.g., SiO2). After reading this disclosure, a person of ordinary skill in the art would readily appreciate the use of the oxide layer 1202 as a screening oxide for the ion implantation for latter phases.

Figure 18:
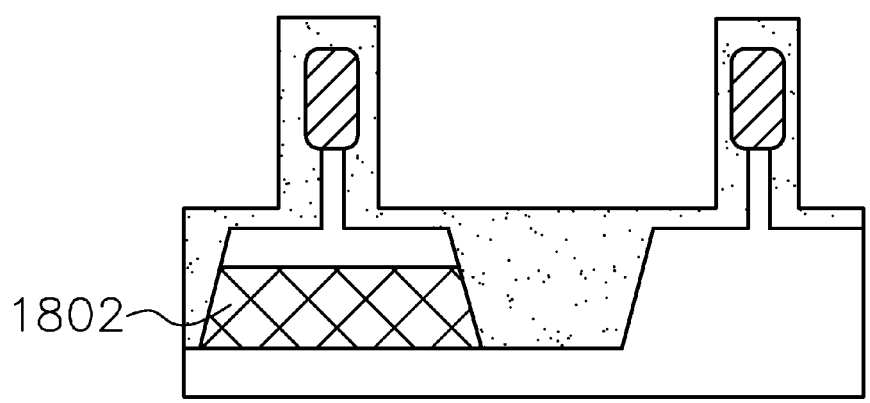

FIG. 18 is a sectional view illustrating the exemplary semiconductor device in accordance with some embodiments. As shown in FIG. 18, by using proper photoresist and anneal, a p-well 1802 for NMOS is formed.

Figure 19:
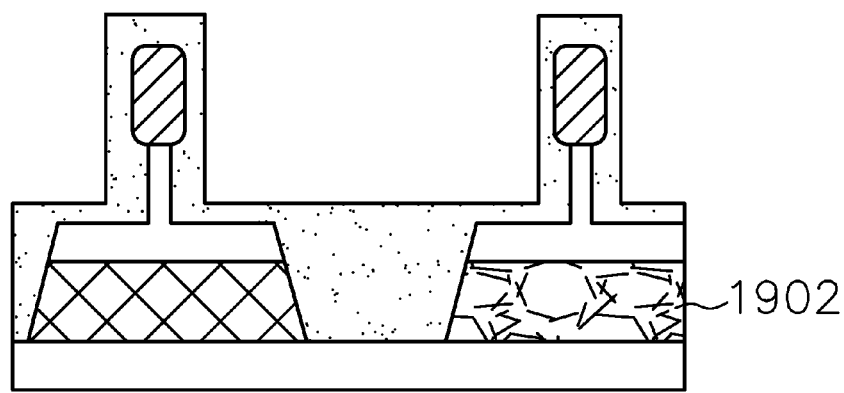

FIG. 19 is a sectional view illustrating the exemplary semiconductor device in accordance with some embodiments. As shown in FIG. 19, by using proper photoresist and anneal, a n-well 1902 for PMOS is formed.

Figure 20:
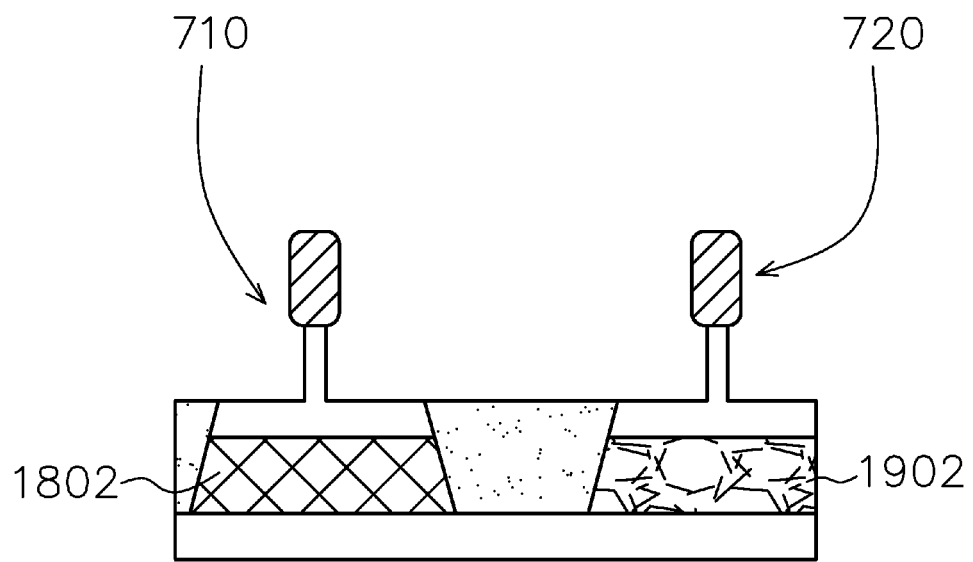

FIG. 20 is a sectional view illustrating the exemplary semiconductor device in accordance with some embodiments. As shown in FIG. 20, plasma ashing is performed removing the photoresist (not shown). The screening oxide (a portion of the oxide layer 1202) is removed. Therefore, the p-well 1802 and n-well 1902 are formed under the first vertical structure 710 and the second vertical structure 720 respectively.

Figure 21:
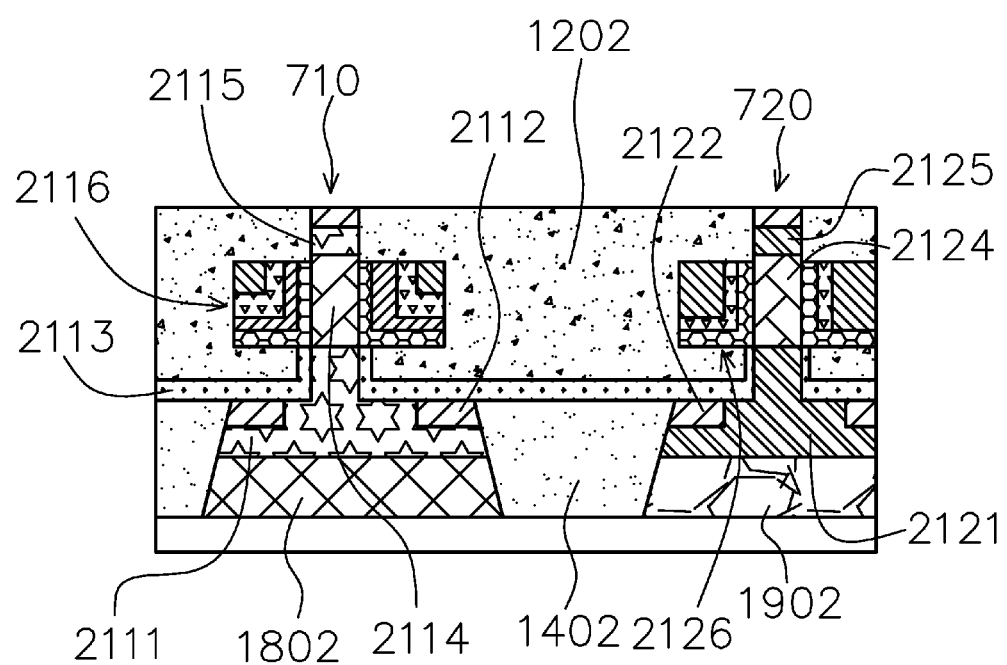

FIG. 21 is a sectional view illustrating the exemplary semiconductor device in accordance with some embodiments. As shown in FIG. 21, the first vertical structure 710 includes a source 2111, a drain 2115, and a channel 2114 which may be formed in the initial phase in FIG. 1 or in the latter phase starting from FIG. 20. Silicide 2112 is formed over the source 2111. A silicon nitride layer 2113 surrounds the source 2111. A channel 2114 is disposed over the source 2111. A drain 2115 is disposed over the channel 2114. A gate 2116 surrounding the channel 2114 includes a high-K dielectrics, work function metal layers, and metal material. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. The second vertical structure 720 has similar structure to the first vertical structure 710 and is not repeated herein.

Figure 22A:
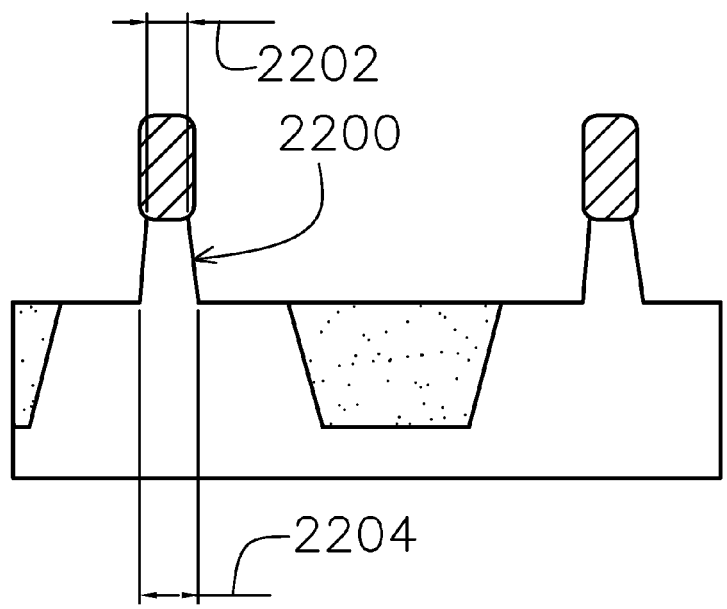
FIGS. 22a, 22b are sectional views illustrating another exemplary semiconductor device in accordance with some embodiments.
Figure 22B:
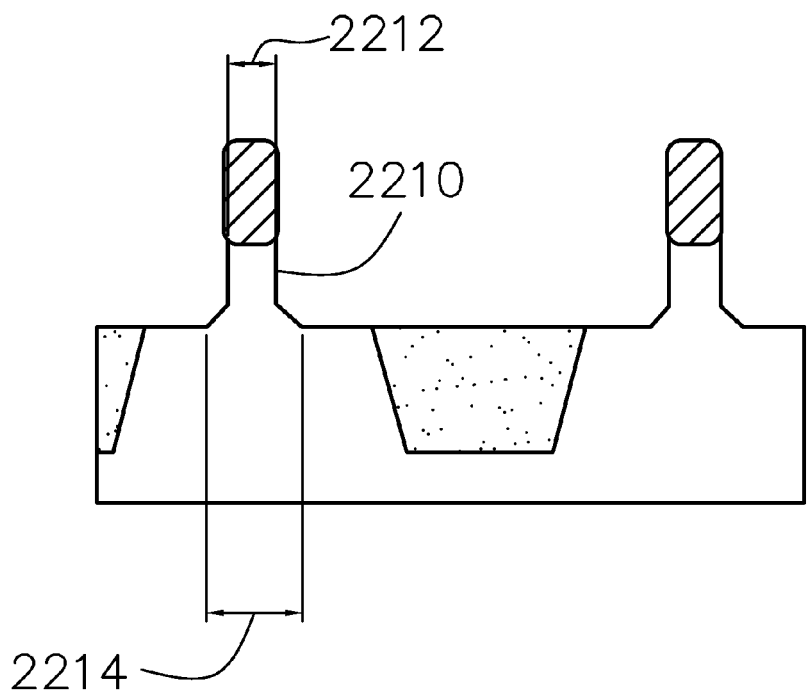

FIGS. 22*a*-22*b* are sectional views illustrating the exemplary semiconductor device in accordance with some embodiments. As shown in FIGS. 22*a*, 22*b*, compared to FIG. 14, a vertical structure 2200 has a tapered profile from its protrusion, and a vertical structure 2210 has a footing profile from its protrusion, while the vertical structure 710 has a straight profile from its protrusion. A ratio of upper widths 2202, 2212 over bottom widths 2204, 2214 may be about 0.5-0.8.

Figure 23:
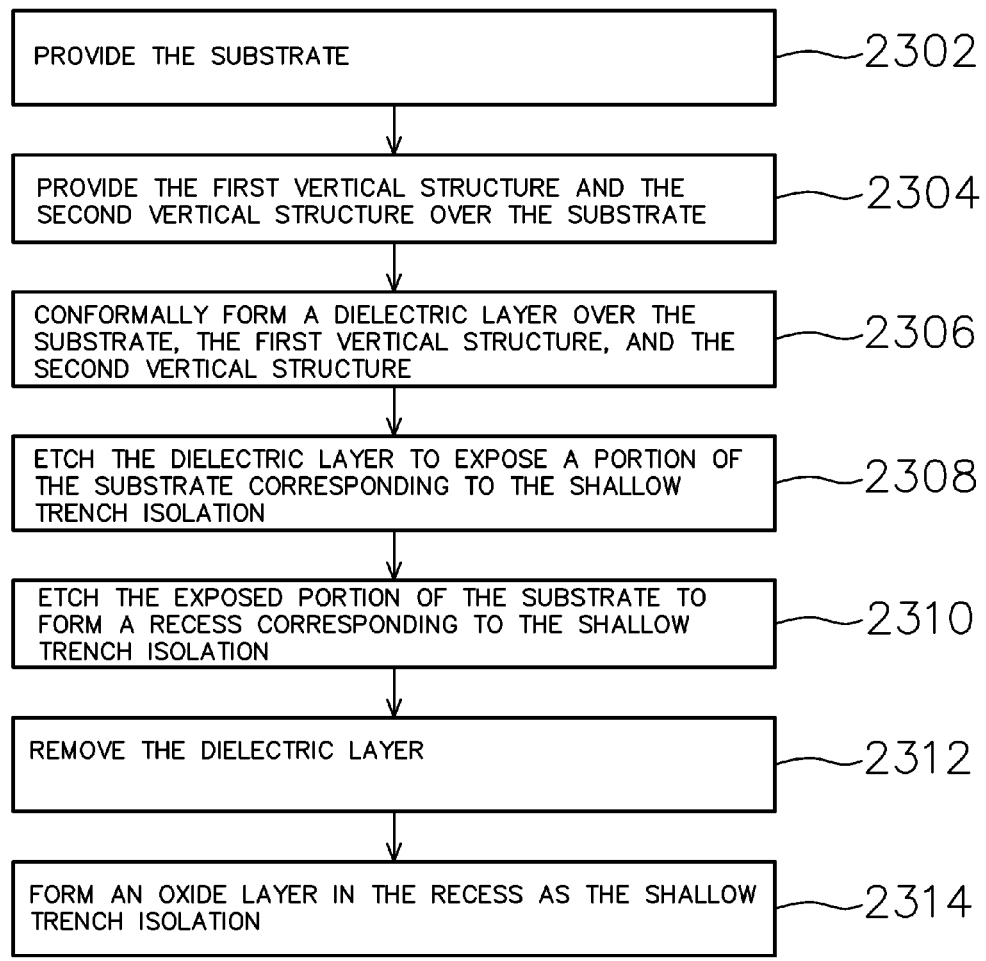
FIG. 23 is a flow chart for a method forming an STI in accordance with some embodiments.

FIG. 23 is a flow chart for a method of forming a shallow trench isolation between a first vertical structure and a second vertical structure in a substrate. As shown in FIG. 23, a method 2300 is provided. The method 2300 includes the following operations: providing the substrate (2302); providing the first vertical structure and the second vertical structure over the substrate (2304); conformally forming a dielectric layer over the substrate, the first vertical structure, and the second vertical structure (2306); etching the dielectric layer to expose a portion of the substrate corresponding to the shallow trench isolation (2308); etching the exposed portion of the substrate to form a recess corresponding to the shallow trench isolation (2310); removing the dielectric layer (2312); and forming an oxide layer in the recess as the shallow trench isolation (2314).

The operation 2306 further includes conformally forming the dielectric layer by using atomic layer deposition. The operation 2308 further includes anisotropically etching the dielectric layer. The operation 2314 further includes: forming the oxide layer over the substrate, the first vertical structure, and the second vertical structure by using flowable CVD; performing CMP on the oxide layer and stopping on the first vertical structure and the second vertical structure; and etching the oxide layer to expose the substrate and to form the shallow trench isolation.

The operation 2308 further includes etching the dielectric layer by using plasma etching. The operation 2310 further includes etching the exposed portion of the substrate by using plasma etching. The operation 2304 further includes conformally forming the dielectric layer made of silicon nitride. The operation 2306 further includes conformally forming the dielectric layer made of silicon oxide. The operation 2310 further includes etching the dielectric layer to form a first spacer adjacent to the first vertical structure and to form a second spacer adjacent to the second vertical structure, a horizontal width of the first spacer being substantially the same as that of the second spacer. The operation 2310 further includes etching the dielectric layer to form the first spacer having the horizontal width of about 5-20 nanometers.

Figure 24:
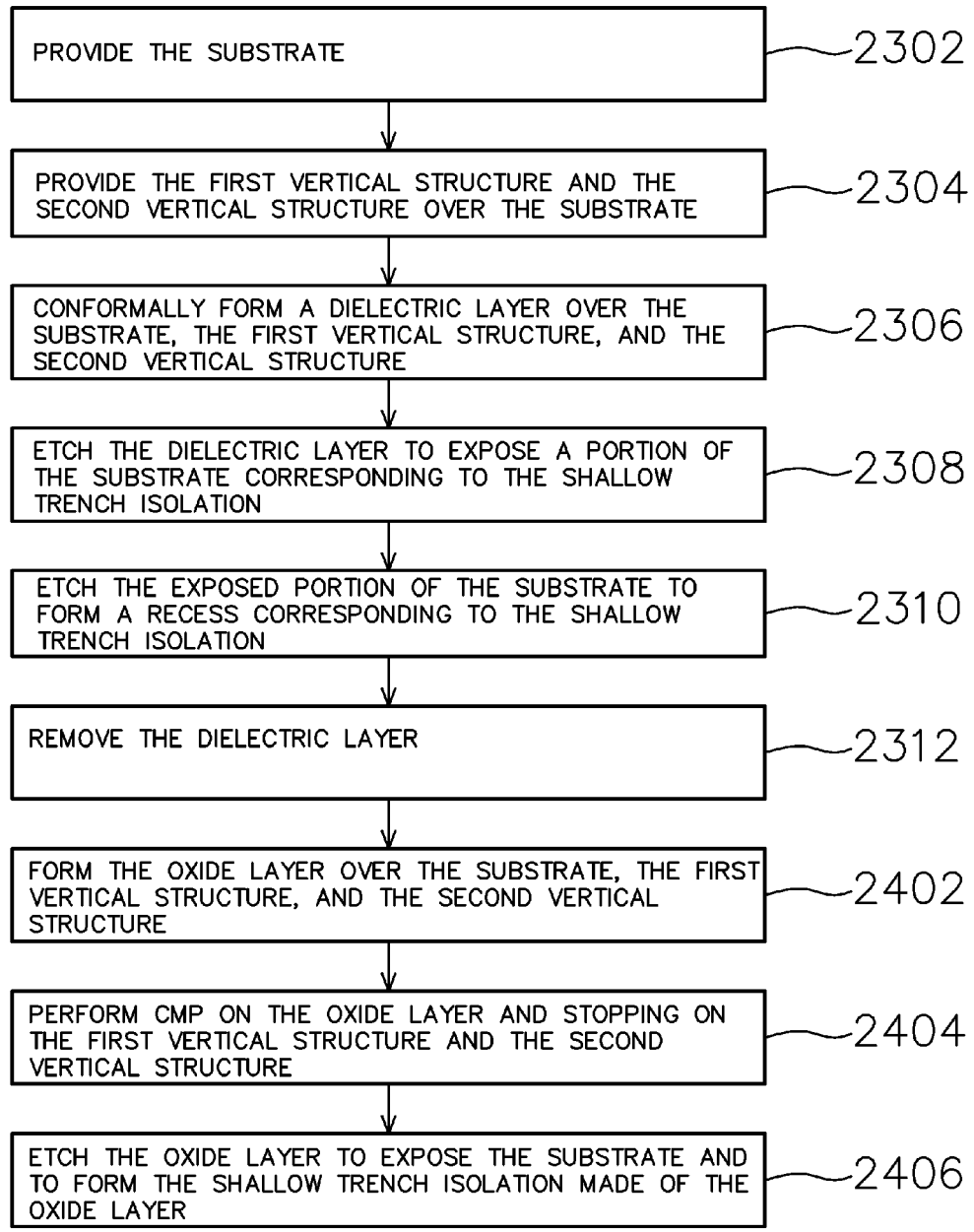
FIG. 24 is a flow chart for a method forming an STI in accordance with some embodiments.

FIG. 24 is a flow chart for a method of forming a shallow trench isolation between a first vertical structure and a second vertical structure in a substrate. As shown in FIG. 24, a method 2400 is provided. The method 2300 includes the following operations: providing the substrate (2302); providing the first vertical structure and the second vertical structure over the substrate (2304); conformally forming a dielectric layer over the substrate, the first vertical structure, and the second vertical structure (wherein the spacing between the vertical structures and the formation of the dielectric layer can be well designed to determine STI location which is defined by the dielectric layer) (2306);

etching the dielectric layer to expose a portion of the substrate corresponding to the shallow trench isolation (2308); etching the exposed portion of the substrate to form a recess corresponding to the shallow trench isolation (2310); removing the dielectric layer (2312); forming the oxide layer over the substrate, the first vertical structure, and the second vertical structure (2402); performing CMP on the oxide layer and stopping on the first vertical structure and the second vertical structure (2404); and etching the oxide layer to expose the substrate and to form the shallow trench isolation made of the oxide layer (2406).

According to an exemplary embodiment, a semiconductor device is provided. The semiconductor device includes: a substrate; a first vertical structure protruding from the substrate; a second vertical structure protruding from the substrate; an STI between the first vertical structure and the second vertical structure; wherein a first horizontal width between the first vertical structure and the STI is substantially the same as a second horizontal width between the second vertical structure and the STI.

According to an exemplary embodiment, a method of forming a shallow trench isolation between a first vertical structure and a second vertical structure in a substrate is provided. The method includes the following operations: providing the substrate; providing the first vertical structure and the second vertical structure over the substrate; conformally forming a dielectric layer over the substrate, the first vertical structure, and the second vertical structure; etching the dielectric layer to expose a portion of the substrate corresponding to the shallow trench isolation; etching the exposed portion of the substrate to form a recess corresponding to the shallow trench isolation; removing the dielectric layer; and forming an oxide layer in the recess as the shallow trench isolation.

According to an exemplary embodiment, a method of forming a shallow trench isolation between a first vertical structure and a second vertical structure in a substrate is provided. The method includes the following operations: providing the substrate; providing the first vertical structure and the second vertical structure over the substrate; conformally forming a dielectric layer over the substrate, the first vertical structure, and the second vertical structure; etching the dielectric layer to expose a portion of the substrate corresponding to the shallow trench isolation; etching the exposed portion of the substrate to form a recess corresponding to the shallow trench isolation; removing the dielectric layer; forming the oxide layer over the substrate, the first vertical structure, and the second vertical structure; performing CMP on the oxide layer and stopping on the first vertical structure and the second vertical structure; and etching the oxide layer to expose the substrate and to form the shallow trench isolation made of the oxide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a shallow trench isolation between a first vertical structure and a second vertical structure in a substrate, comprising:
   providing the substrate;
   providing the first vertical structure and the second vertical structure over the substrate;
   conformally forming a dielectric layer over the substrate, the first vertical structure, and the second vertical structure;
   etching the dielectric layer to expose a portion of the substrate corresponding to the shallow trench isolation;
   etching the exposed portion of the substrate to form a recess corresponding to the shallow trench isolation;
   removing the dielectric layer; and
   forming an oxide layer in the recess as the shallow trench isolation by:
      forming the oxide layer over the substrate, the first vertical structure, and the second vertical structure using flowable CVD;
      performing CMP on the oxide layer and stopping on the first vertical structure and the second vertical structure, and
      etching the oxide layer to expose the substrate and to form the shallow trench isolation.

2. The method of claim 1, wherein conformally forming the dielectric layer over the substrate, the first vertical structure, and the second vertical structure further comprises conformally forming the dielectric layer by using atomic layer deposition.

3. The method of claim 1, wherein etching the dielectric layer to expose the portion of the substrate corresponding to the shallow trench isolation further comprises anisotropically etching the dielectric layer.

4. The method of claim 1, wherein etching the dielectric layer to expose the portion of the substrate corresponding to the shallow trench isolation further comprises etching the dielectric layer by using plasma etching.

5. The method of claim 1, wherein etching the exposed portion of the substrate to form the recess corresponding to the shallow trench isolation further comprises etching the exposed portion of the substrate by using plasma etching.

6. The method of claim 1, wherein conformally forming the dielectric layer over the substrate, the first vertical structure, and the second vertical structure further comprises conformally forming the dielectric layer made of silicon nitride.

7. The method of claim 1, wherein conformally forming the dielectric layer over the substrate, the first vertical structure, and the second vertical structure further comprises conformally forming the dielectric layer made of silicon oxide.

8. The method of claim 1, wherein etching the dielectric layer to expose the portion of the substrate corresponding to the shallow trench isolation further comprises etching the dielectric layer to form a first spacer adjacent to the first vertical structure and to form a second spacer adjacent to the second vertical structure, a horizontal width of the first spacer being substantially the same as that of the second spacer.

9. The method of claim 1, wherein etching the dielectric layer to expose the portion of the substrate corresponding to the shallow trench isolation further comprises etching the dielectric layer to form the first spacer having the horizontal width of about 5-20 nanometers.

10. A method of forming a shallow trench isolation in a substrate between first vertical structure and a second vertical structure, comprising:

providing the substrate;

providing the first vertical structure and the second vertical structure over the substrate;

conformally forming a dielectric layer over the substrate, the first vertical structure, and the second vertical structure;

etching the dielectric layer to expose a portion of the substrate corresponding to the shallow trench isolation;

etching the exposed portion of the substrate to form a recess corresponding to the shallow trench isolation;

removing the dielectric layer;

forming an oxide layer over the substrate, the first vertical structure, and the second vertical structure;

performing CMP on the oxide layer and stopping on the first vertical structure and the second vertical structure; and etching the oxide layer to expose the substrate and to form the shallow trench isolation made of the oxide layer.

11. The method of claim 10, wherein conformally forming the dielectric layer over the substrate, the first vertical structure, and the second vertical structure further comprises conformally forming the dielectric layer by using atomic layer deposition.

12. The method of claim 10, wherein etching the dielectric layer to expose the portion of the substrate corresponding to the shallow trench isolation further comprises anisotropically etching the dielectric layer.

13. The method of claim 10, wherein etching the dielectric layer to expose the portion of the substrate corresponding to the shallow trench isolation further comprises etching the dielectric layer by using plasma etching.

14. The method of claim 10, wherein etching the exposed portion of the substrate to form the recess corresponding to the shallow trench isolation further comprises etching the exposed portion of the substrate by using plasma etching.

15. The method of claim 10, wherein etching the dielectric layer to expose the portion of the substrate corresponding to the shallow trench isolation further comprises etching the dielectric layer to form a first spacer adjacent to the first vertical structure and to form a second spacer adjacent to the second vertical structure, a horizontal width of the first spacer being substantially the same as the second spacer.

16. The method of claim 10, wherein etching the dielectric layer to expose the portion of the substrate corresponding to the shallow trench isolation further comprises etching the dielectric layer to form a first spacer having a horizontal width of 5-20 nanometers adjacent to the first vertical structure and to form a second spacer having a horizontal width of 5-20 nanometers adjacent to the second vertical structure.

17. The method of claim 10, wherein the dielectric layer is of silicon nitride.

18. The method of claim 10, wherein the dielectric layer is of silicon oxide.

19. The method of claim 10, wherein the etching of the oxide layer leaves the shallow trench isolation spaced symmetrically between the vertical structures.

20. The method of claim 10, further comprising, after the etching of the oxide layer, trimming the first and second vertical structures using an in-situ steam generation (ISSG) process.

* * * * *